US005585638A

United States Patent [19]
Hoffman

[11] Patent Number: 5,585,638
[45] Date of Patent: Dec. 17, 1996

[54] X-RAY DETECTOR FOR AUTOMATIC EXPOSURE CONTROL OF AN IMAGING APPARATUS

[75] Inventor: David M. Hoffman, New Berlin, Wis.

[73] Assignee: General Electric Company, Milwaukee, Wis.

[21] Appl. No.: 572,409

[22] Filed: Dec. 14, 1995

[51] Int. Cl.$^6$ ................................................. G01T 1/02
[52] U.S. Cl. .................... 250/370.07; 250/370.1
[58] Field of Search ................. 378/97; 250/370.07, 250/370.1, 370.09

[56] References Cited

U.S. PATENT DOCUMENTS

| | | | |
|---|---|---|---|
| 4,996,413 | 2/1991 | McDaniel et al. | 250/208.1 |
| 5,012,504 | 4/1991 | McFaul et al. | 378/108 |
| 5,079,426 | 1/1992 | Antonuk et al. | 250/370.07 |
| 5,194,736 | 3/1993 | Meulenbrugge et al. | 250/370.09 |
| 5,254,480 | 10/1993 | Tran | 250/370.09 |
| 5,264,701 | 11/1993 | Crain | 250/374 |

*Primary Examiner*—Carolyn E. Fields
*Attorney, Agent, or Firm*—Quarles & Brady

[57] ABSTRACT

An x-ray detector for an automatic exposure control system has a substrate of carbon composite material with a first layer of conductive material on a major surface of the substrate. A second layer of homogeneous semiconductive material, such as CdTe, CdZnTe or amorphous silicon, is deposited on the first layer and has an electrical characteristic, such as conductivity, that varies in response to impingement of x-rays. A third layer of conductive material is formed on the surface of the semiconductor layer and is divided into a plurality of electrode elements which define a plurality of regions in the layer of semiconductive material. By sensing the conductivity between the first layer and each of the electrode elements, the intensity of x-rays striking the different regions can be measured.

16 Claims, 2 Drawing Sheets

X-RAY DETECTOR FOR AUTOMATIC EXPOSURE CONTROL OF AN IMAGING APPARATUS

BACKGROUND OF THE INVENTION

The present invention relates to automatic exposure control systems for x-ray imaging apparatus; and more particularly to x-ray detectors utilized in such exposure control systems.

Conventional fluoroscopic x-ray imaging equipment include a source for projecting a beam of x-rays through an object being imaged, such as a medical patient. The portion of the beam which passes through the patient impinges upon an x-ray detector which converts the x-rays attenuated by the patient into photons which then are converted into an electric image signal. The x-ray detector may comprise an image intensifier tube and a video camera, or a combination of a scintillator in front of a two-dimensional photodetector array. The electrical image signal from either type of detector is processed to display an image of the patient on a video monitor.

The image signal also is applied to the input of a feedback loop which responds to the level of the image signal by producing a control signal which regulates the x-ray exposure and thus brightness of the image on the video monitor. An example of this type of feedback control is described in U.S. Pat. No. 4,573,183. The control signal regulates the biasing of the x-ray tube and the gain of the video camera. This feedback control loop ensures that the image produced in the video monitor has sufficient brightness and contrast for proper viewing by an x-ray technician or physician.

SUMMARY OF THE INVENTION

A general object of the present invention is to provide a separate x-ray detector for the automatic exposure control which is not part of the image detector utilized to produce the image displayed on the video monitor.

Another object of the present invention is to provide an x-ray detector which can be placed in front of or behind the image detector with respect to the source of x-rays.

A further object of the present invention is to provide such a detector which has minimal x-ray attenuation variations so as to minimize inducing visible image artifacts.

These and other objects are fulfilled by an x-ray detector for an automatic exposure control system that comprises a substrate having a major surface on which a first electrode layer is formed. A layer of semiconductive material is deposited on the first electrode and has an electrical characteristic which varies in response to impingement of x-rays. In the preferred embodiment, this latter layer comprises homogeneous semiconductive material, such as CdTe, CdZnTe or amorphous silicon. A second electrode layer is formed on the layer of semiconductor material remote from the first electrode layer. One of the first and second electrode layers is divided into a plurality of conductive elements thereby defining a plurality of regions in the layer of semiconductive material adjacent to each of the plurality of conductive elements.

The semiconductive layer acts as a solid state ion chamber and can be operated in a photovoltaic mode in which an electrical current is produced in this layer in response to x-ray bombardment or operated in a photoconductivity mode in which the conductivity of the semiconductive layer is altered by the x-rays. In either mode, the intensity of x-rays striking the various regions can be measured by sensing the electric current flow between each of the conductive elements and the other electrode layer.

DETAILED DESCRIPTION OF THE INVENTION

Figure 1:
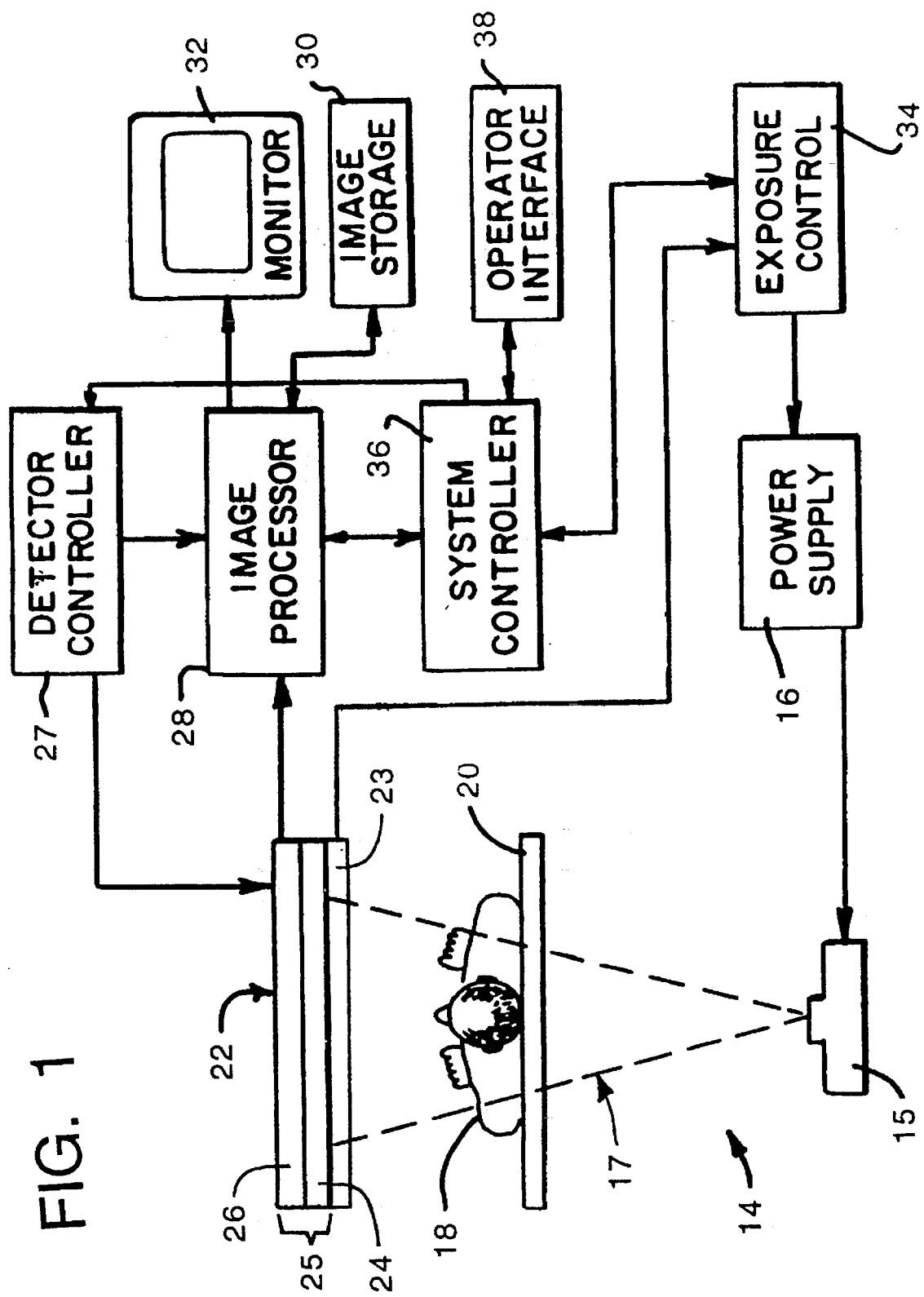
FIG. 1 is a block diagram of an x-ray fluoroscopy system utilizing the present invention.

With initial reference to FIG. 1, an x-ray imaging system 14 includes an x-ray tube 15 which emits an x-ray beam 17 when excited by power supply 16. As illustrated, the x-ray beam 17 is directed through a patient 18 lying on an x-ray transmissive table 20 and impinge upon a detector assembly designated 22. The detector assembly 22 comprises an automatic exposure control (AEC) detector 23 and an imaging device 25 formed in this embodiments by a scintillator 24 in front of a two-dimensional photodetector array 26. The scintillator 24 converts the x-ray protons to lower energy photons in the visible spectrum and the photodetector array 26, contiguous with the scintillator, converts the light photons into electrical signals. The scintillator 24 and photodetector array 26 are well-known components of conventional x-ray detector assemblies used in previous x-ray imaging systems. Alternatively, the AEC detector 23 can be located on the remote side of the detector assembly 22 from the x-ray tube 15. The AEC detector 23 may be used with other types of imaging devices 25, such as an image intensifier with a video camera, or even x-ray film.

A detector controller 27 contains electronics for operating the photodetector array 26 acquire an image by reading a signal from each photodetector element in the two-dimensional array. The output signal from the photodetector array 26 is coupled to an image processor 28 that includes circuitry for processing and enhancing the x-ray image signal. The processed image then is displayed on a video monitor 32 and may be archived in an image Storage device 30.

The overall operation of the x-ray imaging system 14 is governed by a system controller 36 which receives commands from the operator via an operator panel 38.

The x-ray exposure is controlled automatically by a feedback loop that includes the AEC x-ray detector 23 and an exposure control circuit 34. The AEC x-ray detector 23 produces a plurality of electrical signals corresponding to the intensity of the x-rays impinging different regions of the detector. Those signals are applied to inputs of the exposure control circuit 34 along with signals from the system controller 36 designating the desired x-ray dose selected by the operator. The exposure control circuit 34 responds to these input signals by producing a command signal for the x-ray tube power supply 16 which defines the bias voltage and filament current levels for the x-ray tube 15 to produce the desired x-ray dosage. During the x-ray exposure, the exposure control 34 responds to the AEC detector signal, which indicates the intensity of the x-rays passing through the patient 18, by commanding the power supply 16 to increase or decrease the bias voltage and filament current for the x-ray tube 15 to achieve an optimal x-ray exposure for a satisfactory image.

Figure 2:
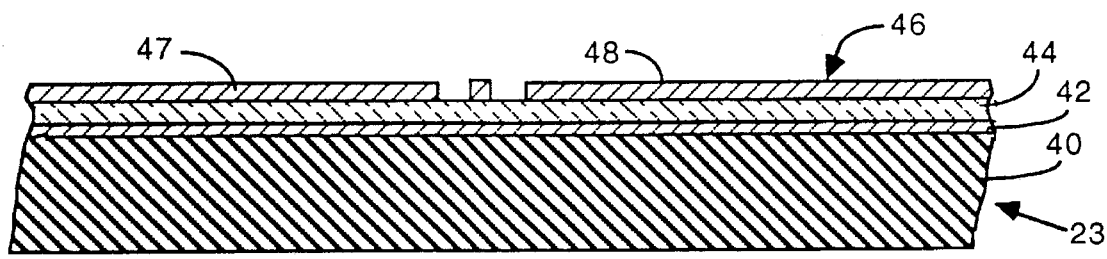
FIG. 2 is a cross-section view through the x-ray detector for automatic exposure controller shown in FIG. 1.

The present invention relates to the unique multiple layer structure of the AEC detector 23 shown in FIG. 2. The active layers are formed on a surface of substrate 40 which preferably comprises a low density carbon composite material containing fibers in a matrix material. Use of such conventional carbon composites is particularly desirable when the AEC detector 23 is placed in front of the photodetector array 26, as the low density material is x-ray transmissive and provides uniform x-ray attenuation. As a consequence, the carbon composite does not induce artifacts in the signal produced by photodetector array 26 enabling the AEC x-ray detector 23 to be placed in front of the scintillator 24 and photodetector array 26. When the AEC detector 23 is placed on the remote side of photodetector array 26, the x-ray transmission characteristics of the substrate 40 are not critical and other materials may be employed.

A uniform first electrode layer 42 is applied over the entire major surface on one side of substrate 40 and serves as a high voltage bias electrode. The first electrode layer 42 is formed by either metallization or other conductive material, such as indium tin oxide, deposited by conventional techniques. The first electrode layer 42 is relatively thin so as to minimally attenuate x-rays passing therethrough.

A thin semiconductive layer 44, such as molecular beam epitaxially deposited CdTe, CdZnTe, amorphous silicon or other semiconductor material, extends over the first electrode layer 42. The semiconductive layer 44 has a good response to x-rays, high efficiency in converting x-rays to an electrical signal, uniform x-ray transmission and long term x-ray stability. The layer 44 of semiconductive material preferably is homogeneous, i.e. p-n junctions are not formed. Thus the semiconductive material acts as a solid state ionization chamber in which charged ions are formed in proportion to the intensity of the x-rays which strike the layer. By collecting the ions to form an electrical signal the x-ray intensity can be measured.

Figure 3:
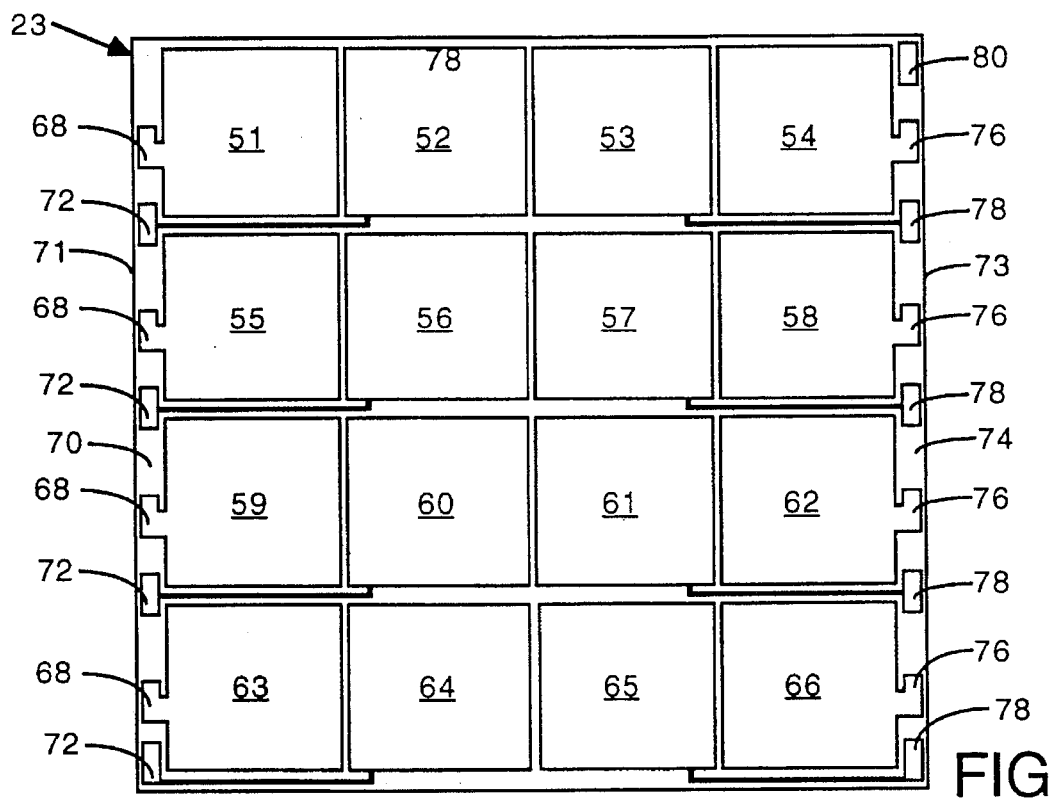
FIG. 3 is a top view of the x-ray detector for the automatic exposure controller.

On top of the semiconductive layer 44 is a second electrode layer 46 comprising a plurality of conductive elements 47 and 48 in a pattern which enables the sensing of x-rays impinging different regions of the semiconductive layer. The second electrode layer 46 is relatively thin so as to minimally attenuate x-rays passing therethrough. An exemplary pattern of conductive elements 51–66 is shown in FIG. 3. This pattern is a four-by-four matrix of rectangular elements on the surface of semiconductive layer 44. Four conductive elements 51, 55, 59, and 63 along one edge 71 of the AEC detector 23 are connected electrically to individual contact pads 68 in a first margin 70 along that edge 71. An additional set of four contact pads 72 is formed on the first margin 70 with conductive stripes extending therefrom between the outer electrode elements to interior electrode elements 52, 56, 60 and 64. The opposite side 73 of the AEC detector 23 has a second margin 74 with for contact pads 76 connected to outer electrode elements 54, 58, 62 and 66 immediately adjacent the second margin. Another set of four contact pads 78 is formed within the second margin 74 with separate conductors extending therefrom between the outer electrode elements to four interior electrode elements 53, 57, 61, and 65. The second margin 74 has an additional contact pad 80 which extends through an opening in the semiconductive layer 44 to provide electrical contact with the first electrode layer 42. The plurality of contact pads 68, 72, 76, 78 and 80 are connected by individual wires to separate inputs of the exposure control 34.

Although a four-by-four matrix of rectangular electrode elements is illustrated in FIG. 3 other geometric matrix patterns and shapes of individual electrode elements of the second electrode layer 46 are within the purview of the present invention. In addition, the electrode elements do not have to be spaced over the entire surface of the substrate, but may be positioned periodically on the surface or only at the corners depending upon the degree of x-ray sensing desired for the automatic exposure control.

The semiconductive layer 44 can be configured to operate in any common solid state mode, such as the photovoltaic mode or the photoconductivity mode. The exposure control 34 selectively senses the electrical signal produced in the semiconductor material between the first electrode layer 42 and each of the electrode elements 51–66 of the second electrode layer 46. In doing so, the exposure control 34 may apply a high voltage to the first electrode layer 42 to bias the semiconductive layer 44 for drift and collection of x-ray induced charges therein. The collection of charge produces an electrical signal between the first and second electrode layers 42 and 46 which can be locally sensed by detecting the signal at each of the electrode elements 51–66 of the second layer 46.

Thus the exposure control is able to detect the intensity of x-rays striking different portions of the AEC detector 23 and determine from those various signal samples, the power supply command to produce the desired x-ray dosage for optimal image production.

The foregoing description is directed primarily to preferred embodiments of the invention. Although some attention was given to various alternatives within the scope of the invention, it is anticipated that skilled artisans will likely realize additional alternatives that are now apparent from the disclosure of those embodiments. Accordingly, the scope of the invention should be determined from the following claims and not limited by the above disclosure.

I claim:

1. An x-ray detector for a medical imaging system, the x-ray detector comprising:
   a converter for converting x-rays into visible light;
   an imager for converting the visible light received from said converter into an electrical image signal; and
   an automatic exposure control x-ray detector adjacent one of the converter and the imager, and including:
   a) a substrate having a major surface;
   b) a first electrode layer on the major surface;
   c) a layer of semiconductive material deposited on the first electrode and having an electrical characteristic that varies in response to impingement of x-rays; and
   d) a second electrode layer on the layer of semiconductor material and remote from the first electrode layer;
   wherein one of the first and second electrode layers is divided into a plurality of conductive elements thereby defining a plurality of regions in the layer of semiconductive material with each region being adjacent to one of the plurality of conductive elements.

2. The x-ray detector as recited in claim 1 wherein the automatic exposure control x-ray detector is adjacent to the converter; and the substrate is a carbon composite material.

3. The x-ray detector as recited in claim 1 wherein the plurality of conductive elements are arranged in an X by Y matrix, where X and Y are positive integers.

4. The x-ray detector as recited in claim 1 wherein the layer of semiconductive material is homogeneous.

5. The x-ray detector as recited in claim 1 wherein the semiconductive material is selected from a group consisting of CdTe, CdZnTe and amorphous silicon.

6. An detector assembly for an x-ray imaging system which has a source of x-rays, the detector assembly comprising:

a two-dimensional photodetector array which produces a signal from which the x-ray imaging system produces an image; and an detector array for an automatic exposure control of the x-ray imaging system, wherein the detector array is adjacent to the two-dimensional photodetector array and comprises:

(a) a substrate having a major surface;

(b) a first electrode layer on the major surface;

(c) a layer of semiconductive material deposited on the first electrode, and having an electrical characteristic that varies in response to impingement of X-rays; and (d) a second electrode layer on the layer of semiconductor material and remote from the first electrode layer;

wherein one of the first and second electrode layers is divided into a plurality of conductive elements thereby defining a plurality of regions in the layer of semiconductive material with each region being adjacent to one of the plurality of conductive elements.

7. The detector assembly as recited in claim 6 wherein the two-dimensional photodetector array has a major surface that faces a major surface of the detector array.

8. The detector assembly as recited in claim 6 wherein the two-dimensional photodetector array has a major surface that abuts a major surface of the detector array.

9. The detector assembly as recited in claim 6 wherein the plurality of conductive elements are arranged in an X by Y matrix, where X and Y are positive integers.

10. The detector assembly as recited in claim 6 wherein the substrate is a carbon composite material.

11. The detector assembly as recited in claim 6 wherein the layer of semiconductive material is homogeneous.

12. The detector assembly as recited in claim 6 wherein the semiconductive material is selected from a group consisting of CdTe, CdZnTe and amorphous silicon.

13. The detector assembly as recited in claim 6 further comprising a scintillator between the source of x-rays and both the two-dimensional photodetector array and the detector array.

14. An detector assembly for an x-ray imaging system which has a source of x-rays, the detector assembly comprising:

a two-dimensional photodetector array that produces a signal from which the x-ray imaging system produces an image; and an detector array for an automatic exposure control of the x-ray imaging system, wherein the detector array is adjacent to the two-dimensional photodetector array and comprises:

(a) a substrate having a major surface;

(b) a first layer of conductive material forming a single electrode on the major surface;

(c) a second layer of semiconductive material deposited on the first electrode and having a surface opposed to the first electrode, the semiconductive material having an electrical characteristic that varies in response to impingement of x-rays; and (d) a third layer of conductive material on the surface of the layer of semiconductor material, and being divided into a plurality of electrode elements thereby defining a plurality of regions in the layer of semiconductive material with each region being adjacent to one of the plurality of electrode elements.

15. The x-ray detector as recited in claim 14 wherein the layer of semiconductive material is homogeneous.

16. The x-ray detector as recited in claim 14 wherein the semiconductive material is selected from a group consisting of CdTe, CdZnTe and amorphous silicon.

* * * * *